United States Patent [19]

Aizawa et al.

[11] Patent Number: 4,551,642
[45] Date of Patent: Nov. 5, 1985

[54] LEVEL SHIFTING CIRCUIT

[75] Inventors: Koki Aizawa; Akira Haeno, both of Saitama, Japan

[73] Assignee: Pioneer Electronic Corporation, Japan

[21] Appl. No.: 472,331

[22] Filed: Mar. 4, 1983

[30] Foreign Application Priority Data

Mar. 5, 1982 [JP] Japan ............................. 57-30449[U]

[51] Int. Cl.⁴ ........................... H03K 5/08; H03G 3/20
[52] U.S. Cl. .................................... 307/552; 307/264; 307/362; 307/562; 328/149; 330/85; 330/260
[58] Field of Search ................... 307/264, 296 R, 362, 307/552, 562; 328/99, 260, 262; 330/85, 254, 279, 260; 358/34, 171

[56] References Cited

U.S. PATENT DOCUMENTS

| | | | |
|---|---|---|---|
| 3,763,382 | 10/1973 | Horichi et al. | 307/552 |
| 3,985,954 | 10/1976 | Kuniyoshi et al. | 358/171 |
| 4,080,539 | 3/1978 | Stewart | 307/264 |
| 4,142,110 | 2/1979 | Weber | 307/552 |
| 4,185,212 | 1/1980 | Leidich | 307/362 |

FOREIGN PATENT DOCUMENTS 2000657 1/1979 United Kingdom ................. 358/34

*Primary Examiner*—John S. Heyman
*Attorney, Agent, or Firm*—Sughrue, Mion, Zinn, Macpeak, and Seas

[57] ABSTRACT

A level-shifting circuit is arranged such that the amount of level-shifting is controlled so that the DC requirement of a succeeding circuit may be satisfied. In particular, negative feedback control of the amount of level shift results in a constant zero DC potential being maintained at the circuit output.

6 Claims, 4 Drawing Figures

LEVEL SHIFTING CIRCUIT

BACKGROUND OF THE INVENTION

This invention relates to a level shifting circuit.

A conventional level shifting circuit is shown in FIG. 1. In FIG. 1, reference numeral 1 designates the input terminal of the circuit. An input signal which is to be subjected to level shifting is applied to the input terminal 1, which is connected to the base of a first transistor $Q_1$. The emitter of the transistor $Q_1$ is connected through a first resistor $R_1$ to the collector of a second transistor $Q_2$. The base of the transistor $Q_2$ is connected to a base potential power supply source $V_B$ provided only for this transistor or for this transistor and other transistors. The emitter of the second transistor $Q_2$ is grounded through a second resistor $R_2$.

The level shifting circuit is organized as described above. Therefore, the transistor $Q_2$ allows a predetermined current to flow in the ground potential direction, and the signal output which has been subjected to level shifting is directly provided at the collector of the transistor $Q_2$, or obtained at the output terminal 2 through a suitable buffer (not shown).

The operation of this level shifting circuit will be described with reference to the following expressions under the conditions that, for convenience in description, in each of the transistors $Q_1$, $Q_2$, the current amplification is sufficiently large and the base-emitter forward voltage $V_{be}$ is constant irrespective of the current value.

The current I in the transistor $Q_2$ is a constant current defined by the following expression:

$$I = (V_B - V_{be})/R_2$$

This current I also flows in the transistor $Q_1$ and the resistor $R_1$. Accordingly, when an input voltage $E_i$ is provided, the output voltage $E_O$ is:

$$E_O = E_i - V_{be} - R_1 I$$
$$= E_i - \left\{ V_{be}\left(1 - \frac{R_1}{R_2}\right) + \frac{R_1}{R_2} V_b \right\}$$
$$= E_i - V_s$$

In the above-described equation, $$V_s = \left\{ V_{be}\left(1 - \frac{R_1}{R_2}\right) + \frac{R_1}{R_2} V_B \right\}$$

and all the terms in the brackets { } are constants. Therefore, irrespective of the input voltage $E_i$, the output voltage $E_O$ is always lower by the constant value $V_s$ than the input voltage $E_i$; that is, the input voltage $E_i$ is level-shifted by $V_s$ to form the output voltage $E_O$.

With respect to alternating current, when the transistor $Q_2$ side is viewed from the output terminal 2, the impedance r thereof is much larger than the resistance $R_1$. Therefore, $$\Delta E_o = \frac{r}{r + R_1} \cdot \Delta E_i$$

$$\approx \Delta E_i$$

Thus, the loss between input and output may be neglected.

As is apparent from the above description, in the conventional level shifting circuit, the shift amount is constant. Therefore, this circuit is disadvantageous in the following points: In a case, for example, where the input signal is an AC signal with a DC potential variation, and the AC component is amplified by a differential amplifier, one side of which is fixed in potential, the dynamic range of the differential amplifier is limited by the DC variation. Accordingly, sometimes one is forced to employ a capacitive coupling circuit, or to decrease the gain of the differential amplifier. This is a serious problem in providing a level shifting circuit in the form of an integrated circuit (IC).

In general, in a silicon monolithic IC, the parameter $f_T$ of a PNP transistor is of the order of 1 to 2 MHz, except for that of a substrate type PNP transistor. Accordingly, it is impossible to apply such PNP transistors to an integrated circuit which can amplify a signal having a frequency band up to several megahertz substantially linearly by 20 to 25 dB. On the other hand, in an integrated circuit (IC), frequently the internal circuit must employ a direct coupling arrangement because of the required number of pins of the package, etc. Because of this fact, and the above-described fact that PNP transistors are not employable, the circuit transistor biasing condition is more shifted towards the supply voltage in the rear stage than in the front stage. On the other hand, the signal level becomes larger towards the rear stage; i.e., its amplitude becomes larger towards the rear stage, while the DC potential is shifted in such a manner that the difference between the DC potential and the supply voltage decreases. As a result, the dynamic range is gradually decreased towards the rear stage. This is undoubtedly undesirable.

In order to overcome the above-described difficulty, a constant voltage-type level shifting circuit comprising NPN transistors as shown in FIG. 1 is connected between stages, thus releasing the direct current condition. However, with the above-described conventional circuit, in the case where a DC component is superposed on the signal to be handled, the same DC variation appears even after the signal has been level-shifted. This is considerably disadvantageous in the case when the circuit is connected to a differential amplifier having one input connected to the aforementioned output and the other input receiving a fixed DC potential, as mentioned above. In the case of an integrated circuit, it is impossible to set the current at a large value because the power consumption of the chip is limited. That is, in the differential amplifier, the operating current and resistance applied to the emitter cannot be large, as a result of which the dynamic range in its operation as a differential amplifier is limited. Accordingly, the amplification of a high frequency signal with a DC variation may cause difficulties such that the differential amplifier, being saturated with the DC variation only, cannot amplify the required AC component.

SUMMARY OF THE INVENTION

In view of the foregoing, an object of this invention is to provide a level-shifting circuit which, especially in an integrated circuit for handling a signal in which an AC signal of several mHz includes a DC variation, can effectively amplify a high frequency signal without employing PNP transistors in the signal path and without causing the number of pins of the IC to increase because of capacitive coupling.

DETAILED DESCRIPTION OF THE PREFERRRED EMBODIMENTS

The present invention will now be described with reference to FIGS. 2 through 4.

Figure 1:
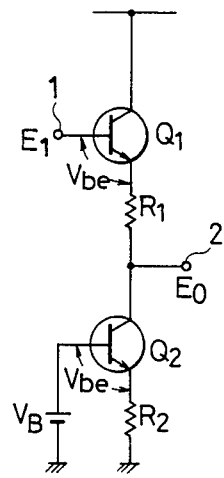
FIG. 1 is a circuit diagram showing one example of a conventional level-shifting circuit.
Figure 2:
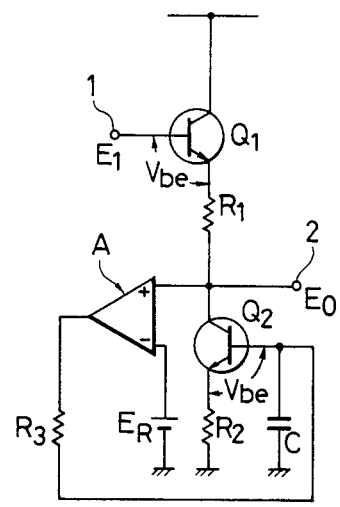
FIG. 2 is a circuit diagram showing the fundamental arrangement of a level-shifting circuit according to this invention.

FIG. 2 is a circuit diagram showing the basic arrangement of a level-shifting circuit according to the invention. In FIG. 2, those elements which have been previously described with reference to FIG. 1 are accordingly designated by the same reference characters or numerals. The input terminal 1, the first transistor $Q_1$, the first resistor $R_1$, the second transistor $Q_2$ and the output terminal 2 are connected similarly to the case of FIG. 1. However, it should be noted that the level-shift circuit in FIG. 2 is different from that in FIG. 1 in the manner of the application of a potential to the base of the transistor $Q_2$. More specifically, in the conventional circuit in FIG. 1, a fixed potential for exclusive or common use was applied to the base of the transistor $Q_2$, while in the circuit of the invention, the base potential of the transistor $Q_2$ is the output of a low-pass filter consisting of a third resistor $R_3$ and a capacitor C, which are connected to the output terminal of a high-gain voltage amplifier A as shown in FIG. 2. The non-inverting input terminal of the high-gain voltage amplifier A is connected to the output point 2, and the inverting input terminal is connected to a reference power source $E_R$.

As is apparent from the above description, the level-shifting circuit of the invention is designed so that it has a negative feedback loop with respect to direct current. The constants in the loop are selected so that the one circulation loop gain of the negative feedback loop is negative in dB with respect to the lowest frequency AC components of a signal applied as an input thereto.

In the circuit of FIG. 2, the current application factor of each of the transistors $Q_1$ and $Q_2$ is sufficiently large, and the base-emitter forward voltage $V_{be}$ is constant. The constants are selected so that the DC conditions are set to desired values after level-shifting and, with respect to alternating current, the loop gain is smaller than one (1) in the handled signal frequency band. Under the above-described conditions, the DC condition of the circuit in FIG. 2 will be described.

In the circuit in FIG. 2, the following relations can be obtained:

$$E_i - V_{be} - R_1 I = E_o$$

$$\frac{1}{R_2} \{a(E_o - E_R) - V_{be}\} = I$$

where a is the gain of the amplifier A.

When the parameter I is eliminated from the above-described relations, $E_O$ can be expressed by:

$$E_O = \frac{\left\{E_i - V_{be}\left(1 - \frac{R_1}{R_2}\right)\right\} + \frac{R_1}{R_2} \cdot a \cdot E_R}{1 + \frac{R_1}{R_2} \cdot a}$$

$$= \frac{1}{1 + \frac{R_1}{R_2} \cdot a}\left\{E_i - V_{be}\left(1 - \frac{R_1}{R_2}\right)\right\}$$

$$+ \frac{\frac{R_1}{R_2} \cdot a \cdot E_R}{1 + \frac{R_1}{R_2} \cdot a}$$

When $R_1/R_2 \cdot a \gg 1$ (much larger than one (1)), then $E_O \cong E_R$. Thus, the level-shifted output coincides with the reference voltage $E_R$ at all times, irrespective of the input potential.

In other words, while in the conventional circuit the input signal is level-shifted by a predetermined amount at all times, in the circuit of the invention, the amount of level shift is automatically varied with the input potential variation so that the level-shifted output has a constant potential at all times.

Figure 3:
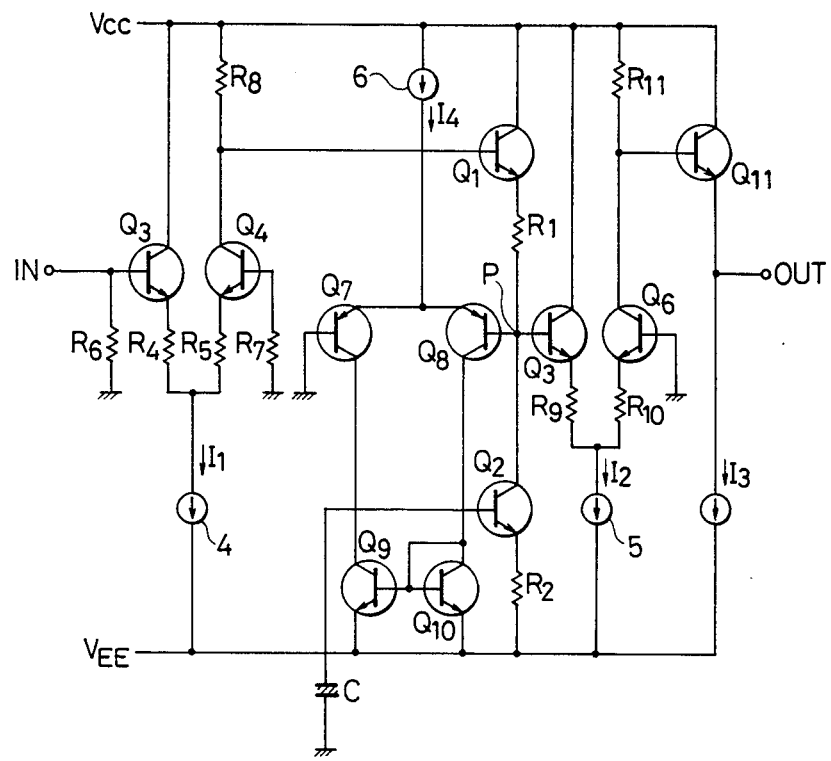
FIG. 3 is a circuit diagram showing one application of the level-shifting circuit according to the invention.
Figure 4:
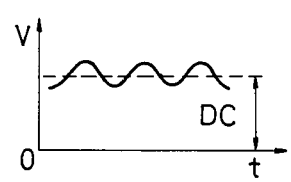
FIG. 4 is a graphical representation indicating one example of an input signal waveform in the case where the circuit of the invention is most effective in operation.

FIG. 3 shows an example of the application of the level-shifting circuit according to the invention, in which the circuit is most effective in operation. More specifically, FIG. 3 shows an example of the application of the circuit according to the invention to a high frequency amplifier circuit for amplifying the output signal of an optical pickup. This particular application is an integrated circuit capable of amplifying a signal having a frequency band up to several MHz substantially linearly by 20 to 25 dB. The circuit in FIG. 3 will be described with reference to the case where an input signal having a DC component as shown in FIG. 4 is applied thereto. In FIG. 3, those components which are equivalent to those in FIG. 2 are accordingly designated by the same reference numerals or characters.

In the circuit of FIG. 3, the input signal is applied through an input terminal IN to a first differential amplifier which comprises transistors $Q_3$ and $Q_4$, resistors $R_4$ and $R_5$ and a constant current source 4 for supplying a current $I_1$. More specifically, the input signal is applied to the base of the transistor $Q_3$, which is grounded through a resistor R . The base of the other transistor $Q_4$ is also grounded through a resistor $R_7$. The resistors $R_4$ and $R_5$ are generally equal to each other in resistance. The resistance and the current value of the constant current source 4 are selected so that the output currents of the transistors $Q_3$ and $Q_4$ are susbtantially in linear proportion to an input signal voltage.

Accordingly, in the DC sense, an output which is about $R_8/(R_4+R_5)$ times the input signal is developed across a resistor $R_8$ connected to the collector of the transistor $Q_4$. Of course, the DC absolute potential is higher than the input.

The potential of the resistor $R_8$ is applied to the base of the transistor $Q_1$, thus being transmitted to the level-shifting circuit of the invention. The point P where a level-shifted output signal is obtained is not only the input terminal of a second differential amplifier which comprises transistors $Q_5$ and $Q_6$, resistors $R_9$ and $R_{10}$ and a second constant current source 5 for supplying a current $I_2$, but is also a DC bias supply point through which a DC bias is supplied to the second differential amplifier.

In the second differential amplifier, the base of the transistor $Q_6$ which receives no input signal is grounded. Therefore, any variation of the DC potential at the point P from the ground potential greatly affects the dynamic range of the second differential amplifier.

In general, the resistors $R_9$ and $R_{10}$ are equal to each other in resistance. This resistance and the constant current substantially determine the aforementioned dynamic range. In the case where the input signal to be handled includes a DC component as described above, the dynamic range of the second differential amplifier is offset by as much as the DC component when compared with the case of an input signal which has the same AC amplitude but no DC component. Thus, the allowable input amplitude with respect to amplification of the AC component is limited.

The circuit point P is connected to the non-inverting input terminal of a high-gain voltage amplifier which comprises transistors $Q_2$, $Q_7$, $Q_8$, $Q_9$ and $Q_{10}$, a resistor $R_2$ and a constant current source 6 for supplying a current $I_4$, and is also connected to the collector of the transistor $Q_2$, which is the current output terminal of the amplifier. The inverting input terminal of the high-gain voltage amplifier, which is essential in the operation of the latter; i.e., the base of the transistor $Q_7$, is grounded, whereby the problem as to the dynamic range of the second differential amplifier is solved.

That is, when the potential at the point P increases in a DC mode, the base potential of the transistor $Q_2$ is increased, and accordingly the current in the transistor $Q_2$ is increased. This current increase increases the voltage drop, across the resistor $R_1$ of the transistor $Q_1$ which is the voltage source, from the emitter potential; i.e., the current increase increases the amount of level shift of the transistor $Q_1$ from the emitter potential. The amount of level shift is controlled so that the potential difference between the inverting input terminal and the non-inverting input terminal of the high-gain voltage amplifier is zero, or so that the bases of the transistors $Q_7$ and $Q_8$ are equally at the ground potential. Also in the case when the potential at the point P decreases, the amount of level shift is controlled in the same manner. This control operation acts upon the DC component. Therefore, the AC component negative feedback path is blocked by the capacitor c so that the negative feedback loop may not operate in the frequency band of the signal to be handled.

As is clear from the above description, as a result of the negative feedback control of the amount of level shift, the DC potential at the point P is always the ground potential irrespective of the magnitude of the DC component of the input signal, and accordingly the AC component oscillates about the ground potential. Accordingly, in the second differential amplifier, the two inputs have zero offset in the DC sense. Thus, the problem where the dynamic range of the differential amplifier is decreased due to this offset is solved, and the necessary AC component is stably amplified.

In the example shown in FIG. 3, the stable potential after control is the ground potential, for convenience in description; however, any potential may be employed as the stable potential. That is, it goes without saying that if the base potential of the transistors $Q_7$ and $Q_6$ is selected as the stable potential, the operation of the circuit is completely the same as that described above.

As is apparent from the above description, the inputs of the second differential amplifier are balanced in the DC sense, and the currents in the transistors $Q_5$ and $Q_6$ are equal, $I_2/2$. Accordingly, the voltage drop across the load $R_{11}$ is constant in the DC sense, and the potential at an output terminal OUT provided by an output buffer, namely, a transistor $Q_{11}$, is constant irrespective of the input DC variation.

Accordingly, in the case where an amplifier having additional stages is formed, if the level shifting circuit according to the invention is interposed between stages, the stage or stages thereafter are free from dynamic range deterioration due to the input DC variation. Therefore, the application of the level-shifting circuit to an integrated circuit is especially effective.

As was described above, according to the invention, the amount of level shift is always controlled so that the DC condition of the circuit thereafter is satisfied. Therefore, the necessary AC signal can be effectively amplified without being limited by the DC condition. Furthermore, in a case where the level-shifting circuit is applied to a multi-stage direct-coupled amplifier, if the level-shifting circuit is inserted between stages, the DC potential in the stages thereafter is fixed. Thus, the invention is advantageous in that it is unnecessary to employ capacitive coupling for an integrated circuit.

What is claimed is:

1. A level-shifting circuit, comprising; a first transistor for converting an input signal voltage into a current; a first resistor having one terminal connected to the emitter of said first transistor, for setting a current value for said first transistor; a second transistor having a collector connected to the other terminal of said first resistor at a connecting point, said second transistor including means as a current source and for supplying said current; a high-gain voltage amplifier having two input terminals and a output terminal, wherein, an input voltage at said connecting point of said first resistor and the collector of said second transistor is applied to one of said input terminals and a reference potential applied at another of said input terminals; and said output terminal of said high-gain voltage amplifier is coupled to the base of said second transistor through a low pass filter, said low-pass filter comprising a signal path between the output of said high-gain voltage amplifier and said base of said second transistor, and a capacitor coupled between said base of said second transistor and ground, said capacitor for grounding said base of said second transistor wherein the level shift is automatically varied with the input variation so that level shifted output is maintained at a constant potential approximately equal to said reference potential.

2. A circuit as claimed in claim 1, wherein said first transistor is an emitter follower connected NPN transistor.

3. A circuit as claimed in claim 1, wherein the emitter of said second transistor is grounded through a second resistor.

4. A circuit as claimed in claim 1, further including a resistor inserted in a signal path from the output of said high-gain voltage amplifier and the base of said second transistor.

5. A circuit as claimed in claim 1, wherein said one input to said high-gain voltage amplifier is provided at a non-inverting input terminal thereof, said one input further constituting an output of said level-shifting circuit; and a reference voltage supplied as an inverting input to said high-gain voltage amplifier.

6. A circuit as claimed in claim 5, wherein said reference voltage is maintained at zero potential, said level-shifting circuit output being maintained at a constant zero DC potential.

* * * * *